US006621873B1

(12) United States Patent
Lee et al.

(10) Patent No.: US 6,621,873 B1
(45) Date of Patent: Sep. 16, 2003

(54) PUNCTURING DEVICE AND METHOD FOR TURBO ENCODER IN MOBILE COMMUNICATION SYSTEM

(75) Inventors: Young-Hwan Lee, Songnam-shi (KR); Min-Goo Kim, Suwon shi (KR); Beong-Jo Kim, Songnam-shi (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/475,559

(22) Filed: Dec. 30, 1999

(30) Foreign Application Priority Data

Dec. 31, 1998 (KR) ................................. 1998-62725

(51) Int. Cl.[7] .............................................. H04L 27/20
(52) U.S. Cl. ........................ 375/295; 375/265; 375/259; 714/786; 714/790
(58) Field of Search .................................. 375/295, 296, 375/142, 130, 265, 259; 370/331, 342; 714/788, 790

(56) References Cited

U.S. PATENT DOCUMENTS 6,044,116 A * 3/2000 Wang .......................... 375/265

* cited by examiner

Primary Examiner—Stephen Chin
Assistant Examiner—Curtis Odom
(74) Attorney, Agent, or Firm—Dilworth & Barrese, LLP

(57) ABSTRACT

A puncturing device for a turbo encoder in a mobile communication system having a turbo encoder which turbo encodes input source data into a plurality of information frames and tail symbols at a given code rate is disclosed. The puncturing device comprises a frame generator for generating a transmission frame by performing puncturing and adding invalid symbols; and a controller for performing puncturing on the information frames according to the code rate, puncturing the tail symbols only when the number of punctured information frames and tail symbols exceeds a bit number according to a symbol rate, and otherwise, controlling the frame generator by reading a puncturing pattern according to the code rate and information about the number of invalid symbols.

11 Claims, 7 Drawing Sheets

PUNCTURING DEVICE AND METHOD FOR TURBO ENCODER IN MOBILE COMMUNICATION SYSTEM

BACKGROUND OF THE INVENTION

1. Field of the Invention

The present invention relates generally to a puncturing device and method for a turbo encoder in a mobile communication system, and in particular, to a puncturing device and method for minimizing puncturing of tail symbols.

2. Description of the Related Art

In mobile communication systems such as satellite, ISDN (Integrated Services Digital Network), digital cellular, W-CDMA (Wideband Code Division Multiple Access) and IMT-2000 communication systems, a channel codec punctures encoded data in order to match symbol rates during transmission of data having different data rates. In particular, the IMT-2000 system can use either a convolutional encoder or a turbo encoder. However, in either case, the rates of the output symbols should be identical to one another because an interleaver typically follows the encoder and has the same memory capacity for storing the symbols.

Generally, the number of output nodes of the convolutional encoder is equal to a code rate. However, in the turbo specific encoder, the number of output nodes is not equal to the code rate and therefore puncturing should be performed to match the code rate. At this point, the tail symbols output from the turbo encoder are also punctured according to the same puncturing pattern as that used for the parity part of the code symbol.

In the convolutional encoder and the turbo encoder, the number of tail symbols required for termination varies depending on the code rate. For example, a constraint; length K=9 convolutional encoder requires (8×(1/code rate)) tail symbols, Column A of Table 1, and a K=4 turbo encoder requires 3×6=18 tail symbols regardless of the code rate (when using two component encoders and separate termination), Column B of Table 1. Therefore, turbo encoder has extra symbols (or reserved symbols, Column C of Table 1) except for the case of the code rate 1/2, as compared with the convolutional encoder. The extra symbols correspond to the difference between Columns A and B and are equal to 0 if negative. When using the turbo encoder, for symbol rate matching, invalid information.('0' or '1' which is known to the receiving side) is added to the reserved symbols to create a frame. Herein, the invalid information added for symbol rate matching will be referred to as invalid symbols. Column C of Table 1 below shows the invalid number of symbols.

TABLE 1

| Code Rate | Tail Symbols for Convolutional Code (A) | Tail Symbols for Turbo Code (B) | Reserved Symbol Number (C) |
|---|---|---|---|
| R = 1/2 | 16(=8 × 2) | 18(=3 × 6) | 0 bit |
| R = 1/3 | 24(=8 × 3) | 18(=3 × 6) | 6 bits |
| R = 1/4 | 32(=8 × 4) | 18(=3 × 6) | 14 bits |

FIG. 1 shows a conceptional block diagram of a common turbo encoder. A description will be made of an operation of puncturing a turbo code, with reference to FIG. 1.

The turbo encoder comprises a first encoder 110, an interleaver 130 and a second encoder 120, and receives an L-bit information frame X. The first encoder 110 encodes the L-bit one information frame X, which is source data, into a first systematic symbol L, a first L-bit parity symbol Y0, a second L-bit parity symbol Y1, and m bit tail symbols for each of the parity signals Y0, Y1 and m tail symbols for first systematic symbol X. The m tail symbols for first systematic symbol L are a tail bit itself, generated by first encoder terminating memory of the encoder. The m tail symbols are generated when the first encoder receives the last three bits of the tail bit, thereby to reset a shift register in the first encoder 110. Further, the information frame X is output, as it is, without coding, and only the m tail symbols for the information frame X are created by the first encoder 110. The interleaver 130 interleaves the input one frame data X and outputs interleaved source data X'. The second encoder 120 encodes the interleaved source data X' into a third parity symbol Y'0, a fourth parity symbol Y'1, and m tail symbols for each of the parity symbol Y'0, Y'1 and m tail symbols for second systematic symbol L'. The m tail symbols for second systematic symbol L' are a tail bit itself, generated by second encoder terminating memory of the encoder. The second encoder can output second systematic symbol X', but all of the second systematic symbol X' is punctured at all of the code rate. Therefore, it is equal to do not output the second systematic symbol X'. In this specification, we describe the turbo encoder outputs several coded symbol frames X, Y0, Y1, Y'0 and Y'1 in response to an input frame, and excluding the interleaved information frame X', and m tail symbols for each of the signals X, Y0, Y1, Y'0, Y'1 and X'. Commonly, there are provided 3 tail symbols for each of the coded symbol frame. However, it is also possible to output the interleaved frame X', as it is, and then delete it in the following stage by puncturing.

Such a turbo encoder internally creates the five coded symbol frames and six sets of tail symbols using one input information frame. The five coded symbol frames and six sets of tail symbols should undergo the same puncturing pattern during creation of a transmission frame, for transmission at a previously defined code rate.

For code rate matching, the proposed IMT-2000 system performs select (inversely say puncturing) as shown in Table 2.

TABLE 2

| | R = 1/2 | R = 1/3 | R = 1/4 |
|---|---|---|---|
| X(t) & X'(t) (Tail Bit) | t = m + i | t = m + i | t = m + i |
| Y0(t) | None | None | t = m + 2 |
| Y1(t) | Alternate at t = m + 2 | t = m + 2 | Alternate at t = m + 3 |
| X'(t) (Info Frame) | None | None | None |
| X'(t) (Tail Bit) | t = m + 3 (when tail bit X'(t) selection) | t = m + 4 | t = m + 5 |
| Y'0(t) | None | None | t = m + 4 |
| Y'1(t) | Alternate at t = m + 2 | t = m + 3 | Alternate at t = m + 3 |

In Table 2, 'm' denotes a given time point, and 'i' in m+i (i=1,2,3,4,5, . . . ) denotes the order of selection at the time m. For example, for a code rate R=1/2, at the time m, the systematic frame X is first selected, the encoded information frame Y0 is punctured all, where "None" means not selected, and one of the encoded symbols Y1 and Y'1 is selected and the non selected one (Y1 OR Y'1 ) is punctured. Further, after the tail symbols for the systematic frame X are selected, one of the tail symbols for the encoded parity symbol frames Y1 and Y'1 are selected and the non selected one (Y1 OR Y'1) is punctured and thereafter, the tail symbols for the interleaved frame X' are selected. After puncturing in this manner, multiplexing is performed to transmit the frame.

Figures 2A, 2B:
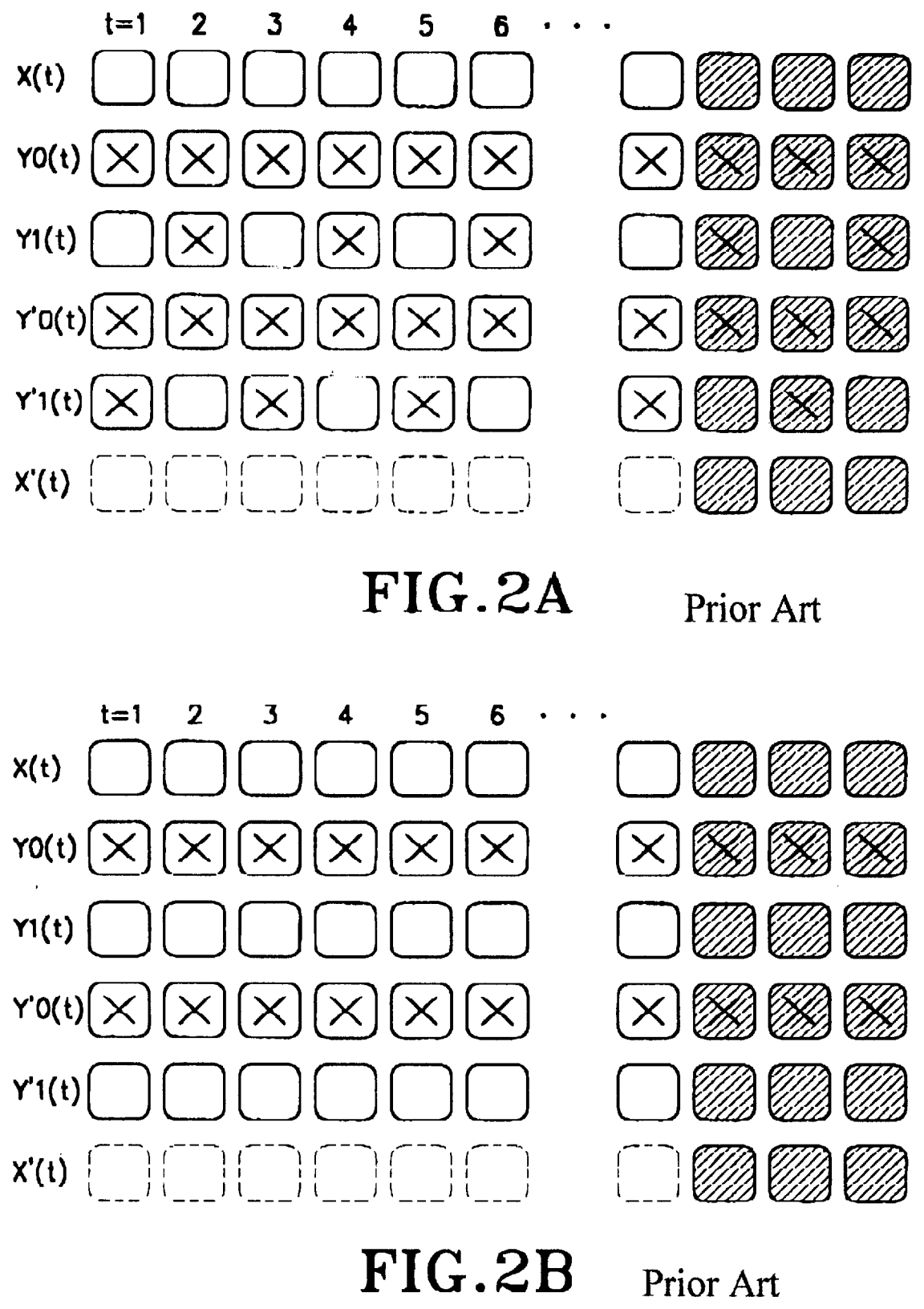
Figure 2C:
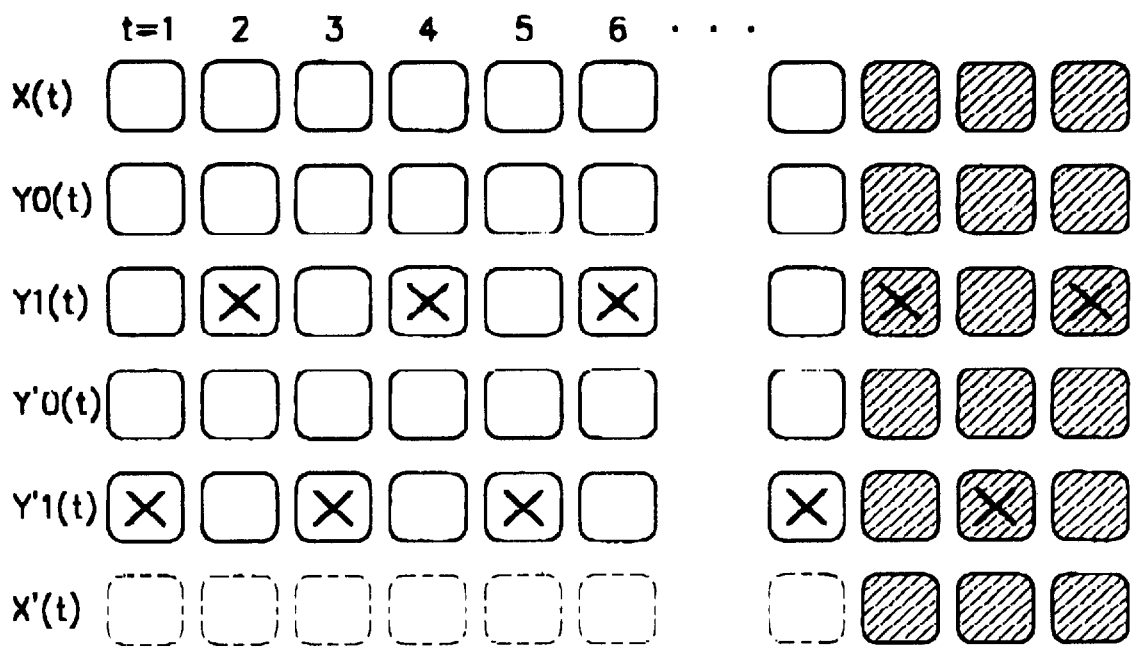

FIGS. 2A to 2C show puncturing methods according to Table 2, for R=1/2, 1/3 and 1/4, respectively. In the drawings, the hatched boxes denote the tail symbols; and the 'X'-marked boxes denote the punctured bits. The boxes corresponding to X'(t) are surrounded by a dashed line as they are not output. This can be expressed with the factors output from the turbo encoder as follows, wherein the underlined factors denote the punctured factors (i.e. not selected).

1) For the case of R =1/2:

X(0),Y0(0),Y1(0),Y'0(0),Y'1(0),                    X(1),
    Y0(1),Y1(1)Y'0(1),Y'1(1),   . . . ,       X(L-1),
    Y0(L-+b 1),Y1(L-+b 1)Y'0(L-+b 1)Y'1(L-1),

T1(0),TP11(0),TP12(0),T2(0),TP21(0),TP22(0),

T1(1),TP11(1),TP12(1),T2(1),TP21(1),T22(1) . . .

T1(m-1),TP11(m-1),
    TP12(m-+b 1),T2(m-1),TP21(m-1),T22(m-+b 1)

where T1 is tail symbol for systematic symbol, TP11 is tail parity for parity Y0, TP12 IS tail parity for parity Y1, TP21 is tail parity for Y'0, TP22 is tail parity for Y'1.

2) For the case of R=1/3:

X(0),Y0(0),Y1(0),Y'0(0),Y'1(0),        X(1),Y0(1),Y1(1),
    Y'0(1),Y'1(1), . . . , X(L-1),Y0(L-+b 1),Y1(L-1),
    Y'0(L-+b 1),Y'1 (L-1),

T1(0),TP11(0),TP12(0),T2(0),TP21(0),T22(0), . . .

T1(m-1),TP11(m-+b 1),TP12(m-1),T2(m-1),
    TP21(m-+b 1),T22(m-1),

RVB(0),RVB(1) . . . ,RVB(h).

where RVB() means reserved bits.

3) For the case of R=1/4:

X(0),Y0(0),Y1(0)Y'0(0),Y'1(0),              X(1),Y0(1),
    Y1(1),Y'0(1),Y'1(1),   . . . ,      X(L-2),Y0(L-2),
    Y1(L-+b 2),Y'0(L-2),Y'1(L-2),

X(L-1),Y0(L-1),Y1(L-1),Y'0(L-1),Y'1(L-+b 1),

T1(0),TP11(0),TP12(0),T2(0),TP21(0),T22(0),

T1(1),TP11(1),TP12(1),T2(1),TP21(1),T22(1) . . .

T1(m-1),TP11(m-1),
    TP12(m-+b 1),T2(m-1),TP21(m-1),T22(m-1),

RVB(0),RVB(1) . . . ,RVB(h).

Table 1 has shown the number of the reserved symbols at every code rate, and Table 2 has shown the puncturing methods. As shown in Tables 1 and 2, even when the tail symbols of the turbo code are punctured, the reserved symbols are generated except for the case of R=1/2. When the tail symbols are punctured, 6 invalid symbols are inserted for R=1/3 as shown in FIG. 2B, and the 3 tail symbols are punctured, 14 invalid symbols are inserted for R=1/4 as shown in FIG. 2C and Table 1.

As described above, even though there remain the reserved symbols, a method for puncturing the encoded information frame is equally applied to the tail symbols in order to match a rate of the symbols added to increase a decoding accuracy, thereby decreasing the decoding capability of the receiver.

SUMMARY OF THE INVENTION

It is, therefore, an object of the present invention to provide a puncturing device and method for a turbo encoder, which minimizes or avoids puncturing of tail symbols using reserved symbols generated while performing turbo encoding.

It another object of the present invention to provide a selection (puncturing) device and method for a turbo encoder, which selection (puncturing) rule is different at the coded symbol frame period and tail symbol selection period for minimize puncturing of tail symbol.

To achieve the above object, there is provided a puncturing device for a turbo encoder in a mobile communication system having a turbo encoder which turbo encodes input source data into a plurality of coded symbol frames and tail symbols at a given code rate. The puncturing device comprises a frame generator for generating a transmission frame by performing puncturing and adding invalid symbols; and a controller for performing puncturing on the symbol frames according to the code rate, puncturing the tail symbols only when the number of selected symbol frames and tail symbols exceeds a bit number according to a symbol rate.

BRIEF DESCRIPTION OF THE DRAWINGS

The above and other objects, features and advantages of the present invention will become more apparent from the following detailed description when taken in conjunction with the accompanying drawings in which:

FIG. 2A is a diagram illustrating a puncturing method of a general R=1/2 turbo encoder according to the prior art;

FIG. 2B is a diagram illustrating a puncturing method of a general R=1/3 turbo encoder according to the prior art;

FIG. 2C is a diagram illustrating a puncturing method of a general R=1/4 turbo encoder according to the prior art;

FIG. 4C is a diagram illustrating a puncturing method of an R=1/4 turbo encoder according to an embodiment of the present invention.

DETAILED DESCRIPTION OF THE PREFERRED EMBODIMENT

A preferred embodiment of the present invention will be described herein below with reference to the accompanying drawings. In the following description, well-known functions or constructions are not described in detail since they would obscure the invention in unnecessary detail.

Figure 1:
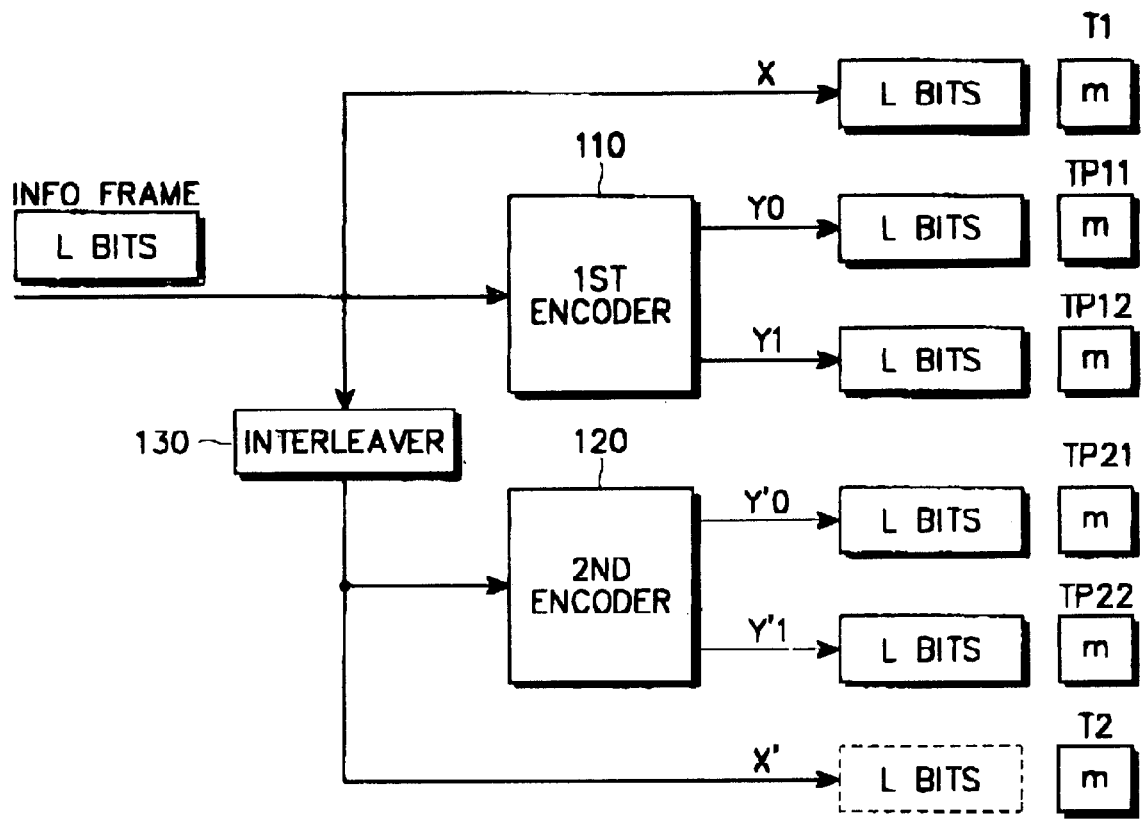
FIG. 1 is a block diagram illustrating a common turbo encoder according to the prior art.
Figure 3:
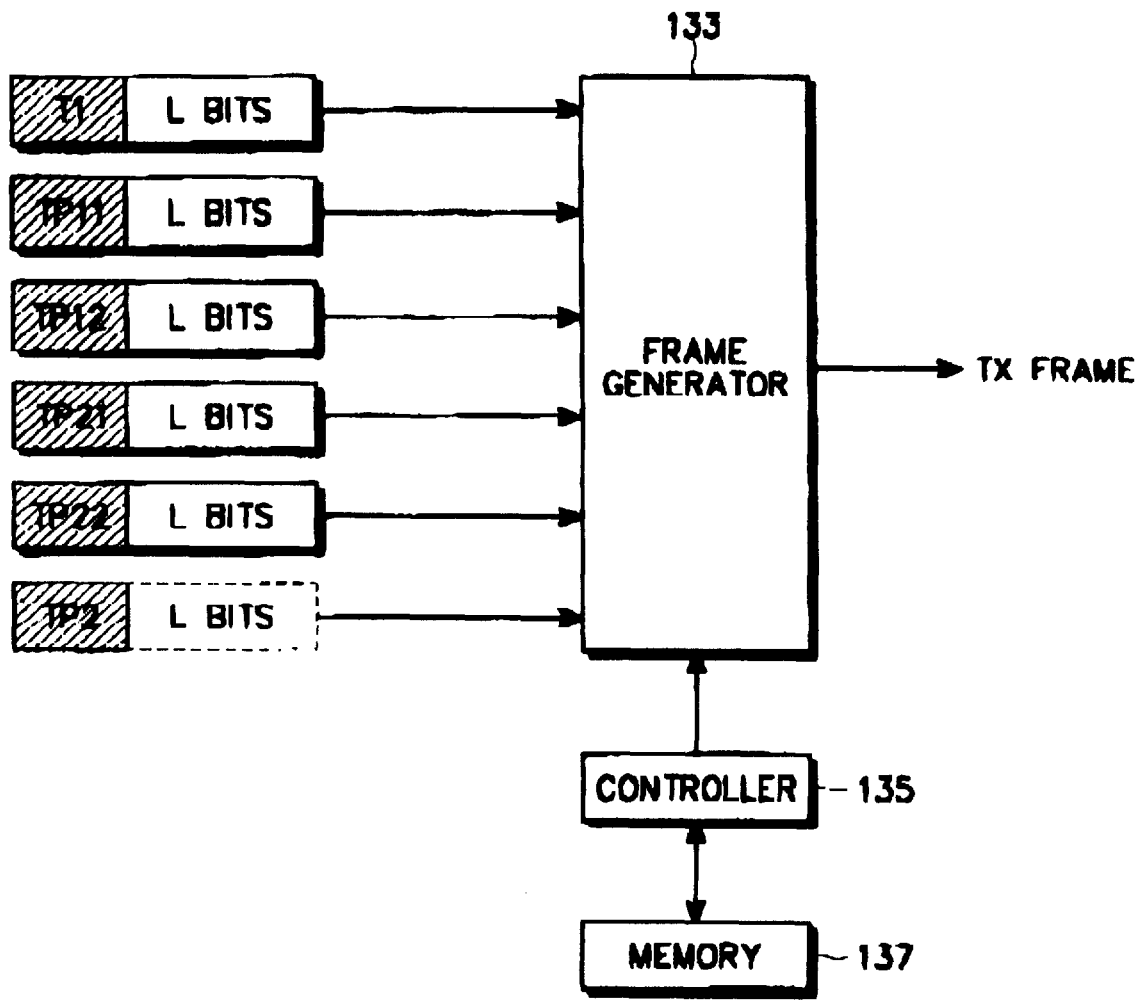
FIG. 3 is a block diagram illustrating a puncturing device for a turbo encoder according to an embodiment of the present invention.

FIG. 3 shows a block diagram of a puncturing device for a turbo encoder according to an embodiment of the present invention. Referring to FIG. 3, upon receiving 5 symbol frames and 6 tail symbols part encoded by the turbo encoder of FIG. 1, a frame generator 133 performs puncturing for code rate matching and symbol rate matching on the received encoded symbols to output a frame of the symbol rate. However, since the total encoded symbols number is larger than the transmission symbol number according to the predetermined code rate, it is necessary to match the code rate and symbol rate by puncturing some of the encoded symbols. At this point, the frame generator 133 according to the present invention is controlled to perform puncturing for code rate matching on the symbol frame and perform puncturing for symbol rate matching on the tail symbols. Further, the frame generator 133 adds invalid symbols to the reserved symbols to generate a frame according to the symbol rate. A memory 137 has information about a puncturing pattern for the code rate and information about the number of the added invalid symbols. A controller 135, which may previously know the code rate of the turbo encoder, controls the frame generator 133 according to the information about the puncturing pattern and the number of the added invalid symbols, thereby performing puncturing for code rate matching, puncturing for symbol rate matching, and invalid symbol inserting.

Figure 4A:
FIG. 4A is a diagram illustrating a puncturing method of an R=1/2 turbo encoder according to an embodiment of the present invention.
Figure 4B:
FIG. 4B is a diagram illustrating a puncturing method of an R=1/3 turbo encoder according to an embodiment of the present invention.
Figure 4C:
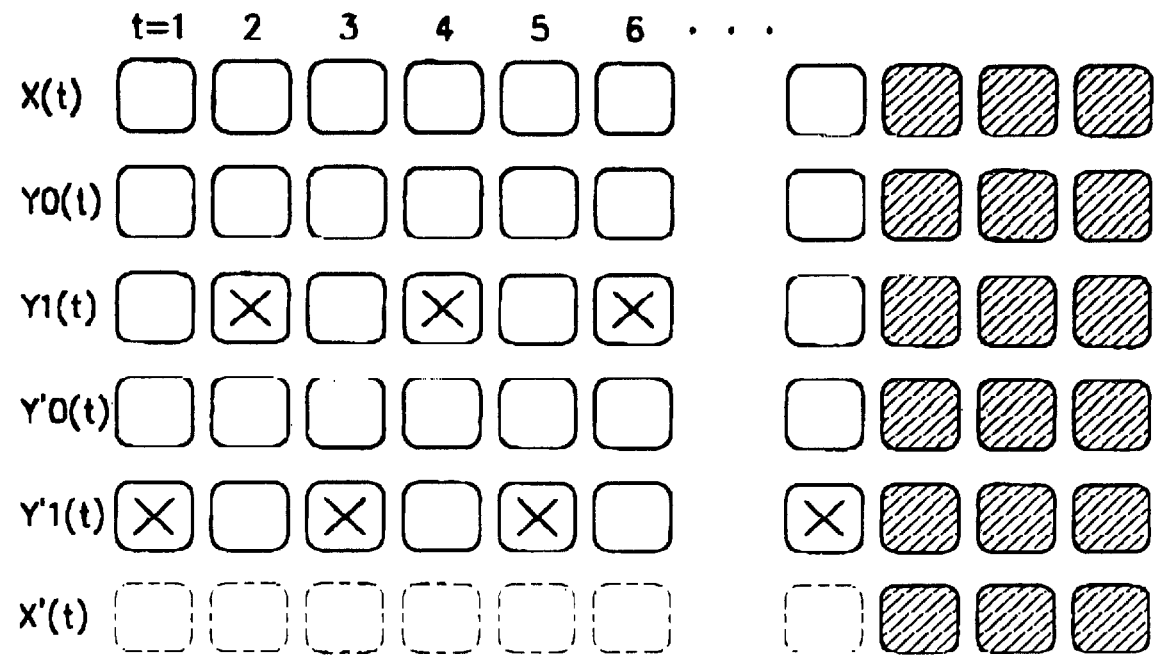

FIGS. 4A to 4C show puncturing methods of the puncturing device for a turbo encoder according to an embodiment of the present invention. More specifically, FIG. 4A shows a puncturing method of an R=1/2 turbo encoder according to an embodiment of the present invention; FIG. 4B shows a puncturing method of an R=1/3 turbo encoder according to an embodiment of the present invention; and FIG. 4C shows a puncturing method of an R=1/4 turbo encoder according to an embodiment of the present invention.

In FIG. 4A, puncturing for code rate matching is performed on the coded symbols frame corresponding to the input information frame, and then two symbols are punctured from 18 coded tail symbols for the tail bits to output 16 tail symbols that the convolutional code can transmit. That is, there are no reserved symbols. However, in FIG. 4B, puncturing for code rate matching is performed on the coded frame symbols corresponding to the input information frame, and then 6 invalid symbols are inserted without puncturing the tail symbols, because there remain 6 reserved symbols when the 18 tail symbols for the turbo code are smaller than the 24 tail symbols for the convolutional code can transmit. Further, in FIG. 4C, when compared with the convolutional code, the turbo code has 14 reserved symbols. Therefore, 14 invalid symbols are inserted without puncturing the tail symbols. That is, puncturing the tail symbols is minimized to increase the decoding accuracy. Generally, the tail symbol is more important than parity symbol at decoding. Therefore, it is preferable to repeat the tail symbols, rather than insert the invalid symbols.

This can be expressed with the factors output from the turbo encoder as follows:

1) For the case of R=1/2:

X(0),Y0(0),Y1(0),Y'0(0)Y'1(0),                      X(1),
    Y0(1),Y1(1)Y'0(1),Y'1(1), . . . , X(L-1),
    Y0(L-+b 1),Y1(L-+b 1)Y'0(L-+b 1),Y'1(L-1),
T1(0),TP11(0),TP12(0),T2(0),TP21(0),TP22(0),
T1(1),TP11(1),TP12(1),T2(1),TP21(1),T22(1) . . .
T1(m-1),TP11(m-+b 1),TP12(m-1),TP2(m-1),
    TP21(m-+b 1),T22(m-1)

2) For the case of R=1/3:

X(0),Y0(0),Y1(0),Y'0(0),Y'1(0),     X(1),Y0(1),Y1(1),
    Y'0(1),Y'1(1), . . . , X(L-1),Y0(L-+b 1),Y1(L-1),
    Y'0(L-+b 1),Y'1(L-1),
T1(0),TP11(0),TP12(0),T2(0),TP21(0),T22(0), . . .
T1(m-1),TP11(m-1),TP12(m-1),T2(m-1),TP21(m-1),
    T22(m-1),
RVB(0),RVB(1),RVB(2) . . . ,RVB(h).

3) For the case of R=1/4:

X(0),Y0(0),Y1(0)Y'0(0),Y'1(0),                 X(1),
    Y0(1)Y1(1)Y'0(1)Y'1(1), . . . , X(L-2),
    Y0(L-+b 2),Y1(L-+b 2),Y'0(L-+b 2),Y'1(L-2),
X(L-1),Y0(L-1),Y1(L-1),Y'0(L-1),Y'1(L-+b 1),
T1(0),TP11(0),TP12(0),T2(0),TP21(0),T22(0),
T1(1),TP11(1),TP12(1),T2(1),TP21(1),T22(1) . . .
T1(m-1),TP11(m-1),TP12(m-1),T2(m-1),TP21(m-1),
    T22(m-1),
RVB(0),RVB(1),RVB(2) . . . ,RVB(h).

Figure 5:
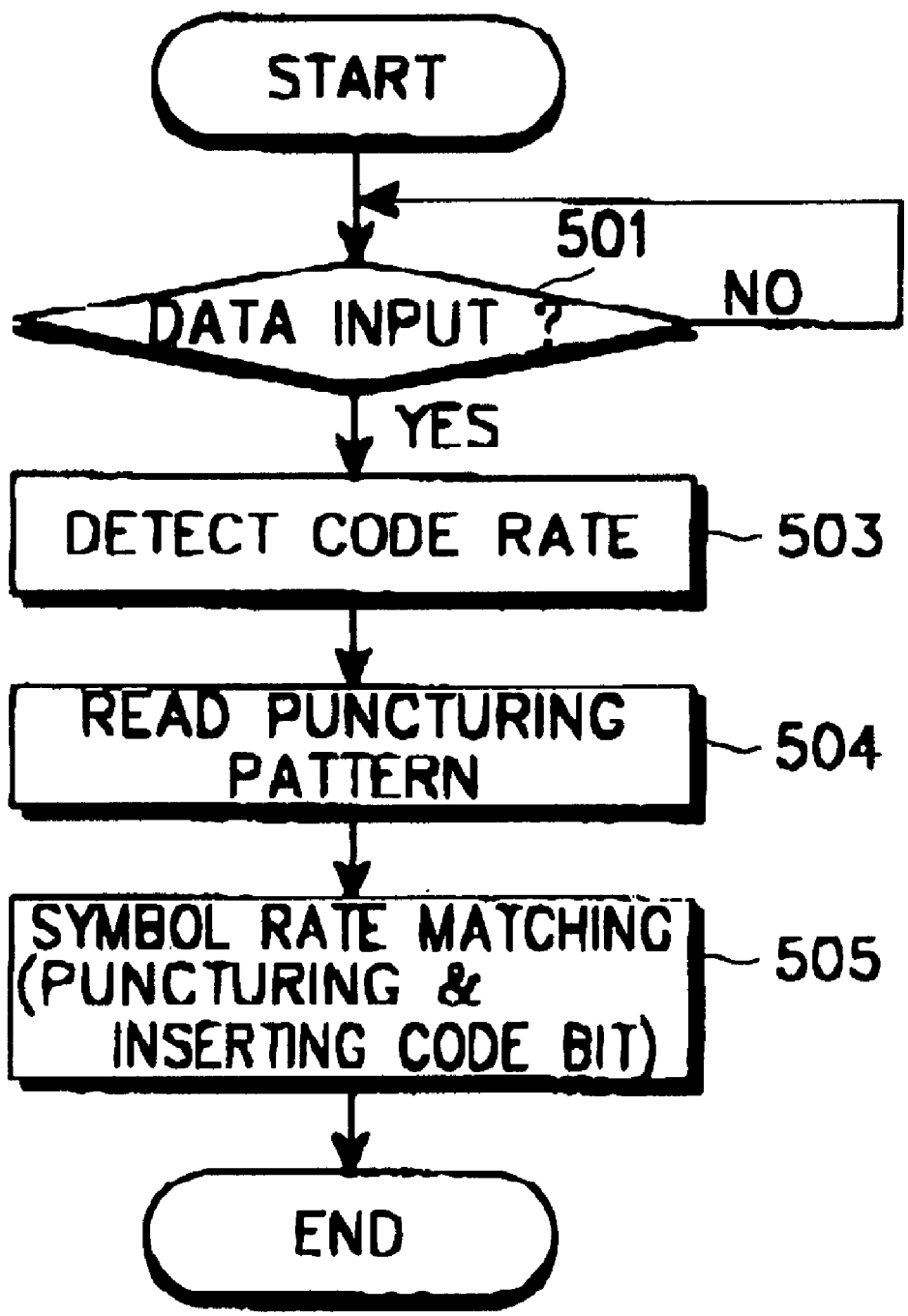
FIG. 5 is a flow chart illustrating a puncturing method for a turbo encoder according to an embodiment of the present invention.

FIG. 5 shows a puncturing method of a turbo encoder according to an embodiment of the present invention. Referring to FIG. 5, the controller 135 examines in step 501 whether data is input from the turbo encoder. The controller 135 may either previously know a code rate of the turbo encoder, or detect the code rate of the data. Upon receipt of data from the turbo encoder, the controller 135 detects a code rate of the received data in step 503 using the above methods. After detecting the code rate, the controller 135 reads a puncturing pattern for the detected code rate in step 504. For example, when the detected code rate is 1/3, the controller 135 reads the puncturing pattern of FIG. 4B. After reading the puncturing pattern, the controller 135 controls puncturing on the parity symbols according to the read puncturing pattern and inserts invalid symbols in the reserved symbols, if any, in step 505. For example, when the detected code rate is 1/2, the controller 135 controls the frame generator 133 to puncture on the parity symbols for code rate matching and on the tail parity symbol for symbol rate matching. For the symbol rate matching two of the tail symbols for the parity signals are punctured. When the code rate matching is 1/4, the controller 135 controls the frame generator 133 to puncture the parity symbol for code rate matching. There is no puncturing on the tail symbol but insertion of reserved bits.

As described above, the novel puncturing device can minimize or avoid puncturing of tail symbols according to the code rate, thereby increasing the decoding capability of the receiver. And this invention provide different puncturing pattern on one frame period for minimizing or avoid puncturing of tail symbol.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A puncturing device for a turbo encoder in a mobile communication system which encodes an input frame data into, a plurality of symbol frames including a systematic symbol frame and parity symbol frames, and tail symbols at a given code rate, the device comprising:

a frame generator for generating a transmission frame by puncturing the encoded symbol; and a controller for controlling said frame generator by controlling said puncturing of the symbol frames according to the code rate, and puncturing the tail symbols only when the number of selected symbol out of the symbol frames and tail symbols exceeds a bit number according to a symbol rate.

2. The puncturing device as claimed in claim 1, wherein said frame generator, under the control of said controller, punctures two symbols out of the tail symbols of; the parity symbol frames according to the code rate when the code rate is 1/2, said tail symbols corresponding to the coded symbol frames.

3. The puncturing device as claimed in claim 1, wherein systematic symbols are not punctured.

4. The puncturing device as claimed in claim 1, wherein said controller further controls said frame generator by reading a puncturing pattern according to the code rate and information about the number of invalid symbols.

5. A puncturing method in a mobile communication system including an encoder for turbo encoding input source data into a plurality of symbol frames and tail symbols at a given code rate, the method comprising the steps of:

detecting the code rate of the turbo encoder;

reading from a memory information about the puncturing pattern for the detected code rate and information about the number of invalid symbols to be added, said information including a puncturing pattern for puncturing from said tail symbols only when the number of coded tail symbols exceeds the number of convolutional tail symbols according to a symbol rate; and performing puncturing according to the information read.

6. The puncturing method as claimed in claim 5, wherein two bits of tail symbols of parity signals and three bits of symbol frames at a puncturing time are punctured, when the code rate is 1/2.

7. The puncturing method as claimed in claim 5, wherein only bits of the symbol frames are punctured, when the code rate is lower than 1/2.

8. A puncturing device for a turbo encoder in a mobile communication system which encodes an input frame data into a systematic code symbol frame, plurality of parity symbol frames and plurality of sets of tail coded symbol at a given code rate, the device comprising;

a frame generator for generating a transmission frame by puncturing at least one of said parity symbols and tail coded symbols; and a controller for controlling said frame generator to puncture said parity symbol frames with a first puncturing pattern and said sets of tail coded symbol with the second puncturing pattern, wherein, said number of punctured symbols in a second puncturing pattern is less than that of the first puncturing pattern.

9. The puncturing device as claimed in claim 8, wherein the first puncturing pattern is for code rate matching.

10. The puncturing device as claimed in claim 8, wherein the second puncturing pattern is for symbol rate matching.

11. A puncturing device for a turbo encoder in a mobile communication system which encodes an input frame data into a systematic code symbol frame, plurality of parity symbol frames and plurality sets of tail coded symbol at a given code rate, the device comprising;

a frames generator for generating a transmission frame by code rate matching and symbol rate matching; and a controller for controlling said frame generator to puncture only said parity symbol frames for code rate matching and to repeat said tail coded symbols according to a number of excess bits.

\* \* \* \* \*